(12) United States Patent
Takahashi et al.

(10) Patent No.: US 10,147,629 B2
(45) Date of Patent: Dec. 4, 2018

(54) ELECTROSTATIC CHUCK DEVICE

(71) Applicant: Sumitomo Osaka Cement Co., Ltd., Tokyo (JP)

(72) Inventors: Kentaro Takahashi, Tokyo (JP); Megumi Ootomo, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 293 days.

(21) Appl. No.: 15/027,026

(22) PCT Filed: Oct. 15, 2014

(86) PCT No.: PCT/JP2014/077399
§ 371 (c)(1),
(2) Date: Apr. 4, 2016

(87) PCT Pub. No.: WO2015/056697
PCT Pub. Date: Apr. 23, 2015

(65) Prior Publication Data
US 2016/0240422 A1     Aug. 18, 2016

(30) Foreign Application Priority Data

Oct. 15, 2013   (JP) .................................. 2013-214638

(51) Int. Cl.
| | | |
|---|---|---|
| H01L 21/683 | (2006.01) | |
| H01L 21/67 | (2006.01) | |
| H02N 13/00 | (2006.01) | |

(52) U.S. Cl.
CPC .... *H01L 21/6833* (2013.01); *H01L 21/67109* (2013.01); *H01L 21/6831* (2013.01); *H02N 13/00* (2013.01)

(58) Field of Classification Search
CPC ........... H01L 21/6833; H01L 21/67109; H01L 21/6831; H02N 13/00
See application file for complete search history.

(56) References Cited

U.S. PATENT DOCUMENTS

2005/0215073 A1*  9/2005  Nakamura ........ H01L 21/67103
                                                          438/778
2005/0215415 A1   9/2005  Hattori
(Continued)

FOREIGN PATENT DOCUMENTS

JP   2005281046 A   10/2005
JP   2008300491 A   12/2008
(Continued)

OTHER PUBLICATIONS

International Search Report of PCT/JP2014/077399 dated Dec. 22, 2014.
(Continued)

*Primary Examiner* — Scott Bauer
(74) *Attorney, Agent, or Firm* — Merchant & Gould P.C.

(57) ABSTRACT

Provided is an electrostatic chuck device in which breakdown between an electrostatic chuck portion and a cooling base portion can be prevented, voltage endurance can be improved, uniformity in the in-plane temperature of a mounting surface of the electrostatic chuck portion where a plate-shaped sample is mounted can be improved, and voltage endurance of a heating member can be improved by applying a uniform voltage between the electrostatic chuck portion and the cooling base portion. An electrostatic chuck device (10) includes: an electrostatic chuck portion (11) that includes a ceramic plate-shaped body and an internal electrode 18 for electrostatic adsorption; and a cooling base portion (12) that adjusts a temperature of the internal electrode (18) for electrostatic adsorption, in which a first insulating member (20) is adhered to a second main surface of the ceramic plate-shaped body through a first adhesive (19) so as to cover a periphery of the internal electrode for electrostatic adsorption (18), a second insulating member (14) is adhered to a top surface of the cooling base portion (12) through a second adhesive (13), a heating member (15)

(Continued)

is provided on a top surface of the second insulating member (14), and the electrostatic chuck portion (11) and the cooling base portion (12) are adhered to each other and integrated through an organic adhesive layer (16).

6 Claims, 1 Drawing Sheet

(56) References Cited

U.S. PATENT DOCUMENTS

| | | |
|---|---|---|
| 2013/0265690 A1 | 10/2013 | Maeta et al. |
| 2014/0008880 A1 | 1/2014 | Miura et al. |

FOREIGN PATENT DOCUMENTS

| | | |
|---|---|---|
| JP | 2011-077303 A | 4/2011 |
| JP | 2013004900 A | 1/2013 |
| WO | WO 2012/128348 A1 | 9/2012 |
| WO | WO 2012/147931 A1 | 11/2012 |

OTHER PUBLICATIONS

Office Action for Japanese Patent Application No. 2013-214638 (dated Apr. 25, 2017).

\* cited by examiner

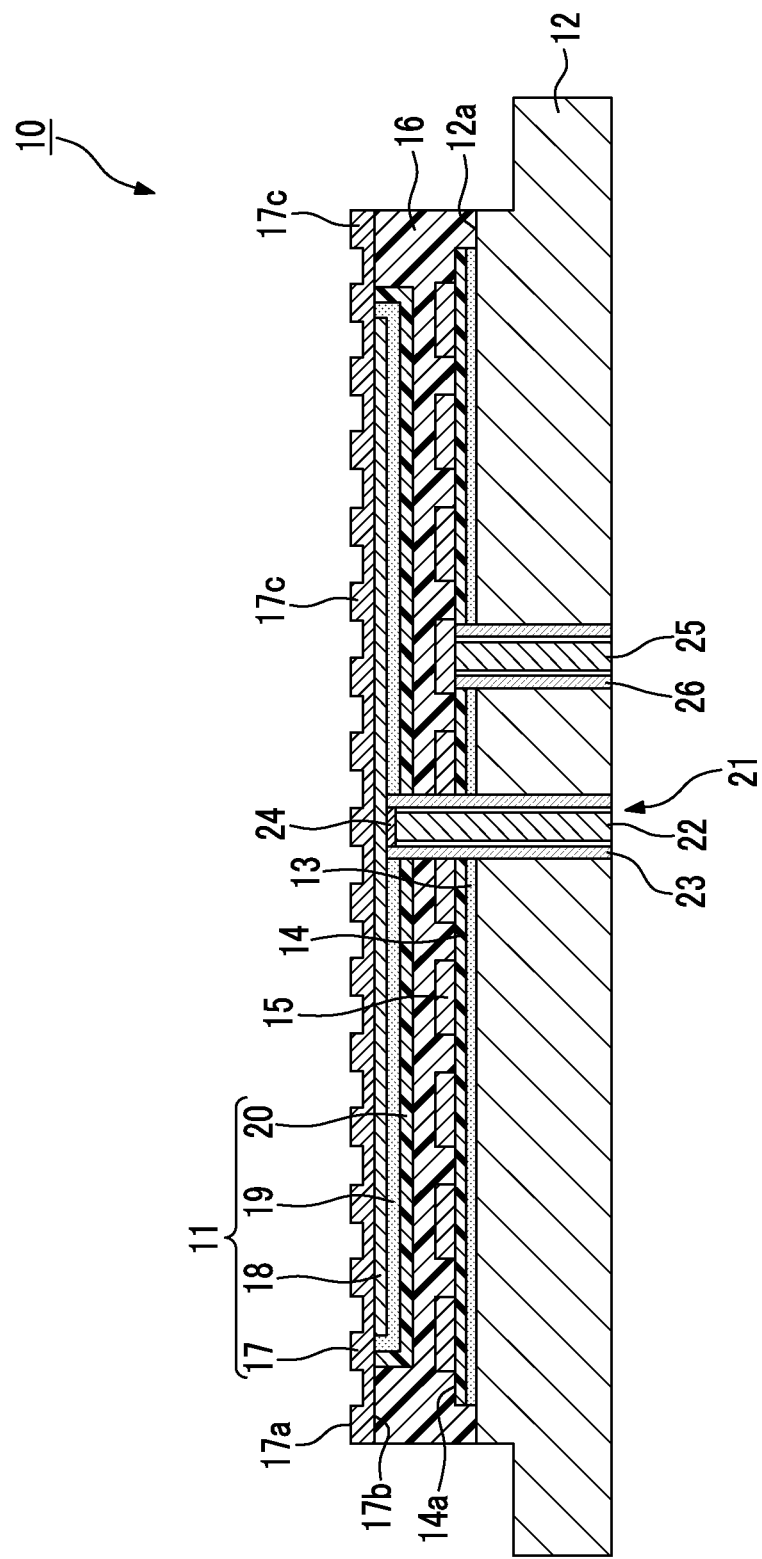

ELECTROSTATIC CHUCK DEVICE

This application is a U.S. National Stage Application under 35 U.S.C. § 371 of International Application No. PCT/JP2014/077399 filed Oct. 15, 2014, which claims the benefit of priority to Japanese Patent Application No. 2013-214638 filed on Oct. 15, 2013, the contents of all of which are hereby incorporated by reference in their entireties.

TECHNICAL FIELD

The present invention relates to an electrostatic chuck device.

This application claims priority based on Japanese Patent Application No. 2013-214638 filed on Oct. 15, 2013, the content of which is incorporated herein by reference.

BACKGROUND ART

Recently, in a semiconductor manufacturing process, further improvement in a microfabrication technique has been required along with an increase in element integration density and performance. In the semiconductor manufacturing process, an etching technique is one of the important microfabrication techniques. Recently, among the etching techniques, a plasma etching technique capable of microfabrication on a large area with high efficiency has been mainly used.

This plasma etching technique is a dry etching technique. In this technique, a mask pattern is formed on a solid material as a workpiece through a resist, and this solid material is supported in a vacuum. In this state, by introducing reactive gas into this vacuum and applying a high-frequency electric field to the reactive gas, accelerated electrons collide against gas molecules to be in a plasma state, radicals (free radicals) produced from the plasma and ions are caused to react with the solid material so as to be removed as a reaction product. As a result, a fine pattern is formed on the solid material.

On the other hand, in a plasma CVD method which is a thin film forming technique, a compound, which is obtained by plasma causing raw material gases to combine with each other, is deposited on a substrate. This method is a film forming method including: applying a high-frequency electric field to gases containing raw material molecules to discharge plasma; decomposing the raw material molecules with electrons accelerated by the plasma discharge to obtain a compound; and depositing the obtained compound on a substrate. A reaction, which does not occur only with thermal excitation at a low temperature, may occur in plasma because gases in the system collide against each other and are activated into radicals. In a semiconductor manufacturing device using plasma such as a plasma etching device or a plasma CVD device, in the related art, an electrostatic chuck device is used as a device which simply attaches and fixes a wafer to a sample stage and maintains the wafer at a desired temperature.

However, in a plasma etching device of the related art, when a wafer fixed to an electrostatic chuck device is irradiated with plasma, the surface temperature of the wafer increases. Therefore, in order to suppress an increase in the surface temperature, the wafer is cooled from the bottom side by circulating a coolant such as water in a base portion for adjusting the temperature of the electrostatic chuck device. However, at this time, an in-plane temperature distribution is generated in the wafer. For example, the temperature at the center of the wafer is high, and the temperature at a peripheral portion thereof is low.

In addition, the in-plane temperature distribution of the wafer varies depending on, for example, a difference in the structure or type of a plasma etching device.

Therefore, a heater function-equipped electrostatic chuck device is proposed in which a heater member is attached between an electrostatic chuck portion and the base portion for temperature adjustment (for example, refer to Patent Literature No. 1).

In this heater function-equipped electrostatic chuck device, a local temperature distribution can be generated in a wafer. Therefore, by setting an in-plane temperature distribution of a wafer according to a film deposition rate or a plasma etching rate, local film formation such as pattern formation on a wafer or local plasma etching can be efficiently performed.

Examples of a method of attaching a heater to an electrostatic chuck device include: a method of providing a heater in a ceramic electrostatic chuck; a method of attaching a heater by applying a heater material to a back side of an adsorption surface of an electrostatic chuck, that is, to aback surface of a ceramic plate-shaped body through screen printing in a predetermined pattern and thermally curing the heater material; and a method of attaching a heater by adhering a metal foil or a sheet-shaped conductive material to the back surface of the ceramic plate-shaped body.

Subsequently, the electrostatic chuck portion, in which a heater is provided or to which a heater is attached, and the base portion for temperature adjustment are adhered to each other and integrated through an organic adhesive, thereby obtaining a heater function-equipped electrostatic chuck device.

CITATION LIST

Patent Literature

[Patent Literature No. 1] Japanese Laid-open Patent Publication No. 2008-300491

SUMMARY OF INVENTION

Technical Problem

However, there are the following problems in the heater function-equipped electrostatic chuck device which is obtained using one of the above-described methods of the related art including: the method of attaching a heater by applying a heater material to a back side of an adsorption surface of an electrostatic chuck, that is, to a back surface of a ceramic plate-shaped body through screen printing in a predetermined pattern and thermally curing the heater material; and the method of attaching a heater by adhering a metal foil or a sheet-shaped conductive material to the back surface of the ceramic plate-shaped body. That is, in a case where the electrostatic chuck portion and the base portion for temperature adjustment are adhered to each other and integrated through an organic adhesive, a fine hole called a pore may be formed in the organic adhesive layer, or a non-adhered portion called cissing may be formed between the organic adhesive layer, the electrostatic chuck portion, and the base portion for temperature adjustment. In this state, in a case where a voltage is applied to a heater, the electrostatic chuck portion and the base portion for temperature adjustment are electrically connected (short-circuiting) to each other, which may lead to breakdown.

In addition, in a case where insulating characteristics are secured by the thickness of an organic adhesive layer, it is difficult to reduce the thickness of the organic adhesive layer. Further, since there is a variation in the thickness of the organic adhesive layer, an in-plane temperature of a surface of an electrostatic chuck portion on which a wafer is mounted cannot be made to be sufficiently uniform.

In addition, in the heater function-equipped electrostatic chuck device which is obtained using a metal foil or a sheet-shaped conductive material, there is a difference in level between a portion where a metal foil or a sheet-shaped conductive material is adhered as a heater pattern and a portion where a heater pattern is not formed. Therefore, in a case where a cooling base is adhered through only a sheet-shaped adhesive, concavo-convex portions of a heater cannot be covered, and a pore and the like is likely to be formed in an adhesive layer. Similarly, in a case where a sheet-shaped thermoplastic adhesive is used, a pore is a formed in a boundary between a portion where a heater is provided and a portion where a heater is not provided, and there are risks of discharge and peeling. In addition, a variation in heat transfer between a heater and a cooling base causes a decrease in the ability to control an in-plane temperature distribution of an electrostatic chuck.

The present invention has been made in order to solve the above-described problems, and an object thereof is to provide an electrostatic chuck device in which breakdown between an electrostatic chuck portion and a cooling base portion can be prevented, voltage endurance can be improved, uniformity in the in-plane temperature of a mounting surface of the electrostatic chuck portion where a plate-shaped sample is mounted can be improved, and voltage endurance of a heating member can be improved by applying a uniform voltage between the electrostatic chuck portion and the cooling base portion.

Solution to Problem

As a result of thorough investigation for solving the above-described problems, the present inventors found that, by adhering a sheet-shaped or film-shaped first insulating member to a second main surface of a ceramic plate-shaped body through a sheet-shaped or film-shaped first adhesive so as to cover a periphery of an internal electrode for electrostatic adsorption, adhering a sheet-shaped or film-shaped second insulating member to a top surface of a cooling base portion through a sheet-shaped or film-shaped second adhesive, providing a heating member on a top surface of the second insulating member, and adhering an electrostatic chuck portion and the cooling base portion, where the heating member is provided, to each other through an organic adhesive layer to be integrated, breakdown between the electrostatic chuck portion and the cooling base portion can be prevented, voltage endurance can be improved, uniformity in the in-plane temperature of a mounting surface of the electrostatic chuck portion where a plate-shaped sample is mounted can be improved, and voltage endurance of the heating member can be improved, thereby obtaining the present invention.

That is, according to the present invention, there is provided an electrostatic chuck device including: an electrostatic chuck portion that includes a ceramic plate-shaped body and an internal electrode for electrostatic adsorption, the ceramic plate-shaped body having a first main surface which is amounting surface on which a sample is mounted, and the internal electrode for electrostatic adsorption being provided on a second main surface of the ceramic plate-shaped body; and a cooling base portion that adjusts a temperature of the internal electrode for electrostatic adsorption, in which a sheet-shaped or film-shaped first insulating member is adhered to the second main surface of the ceramic plate-shaped body through a sheet-shaped or film-shaped first adhesive so as to cover a periphery of the internal electrode for electrostatic adsorption, a sheet-shaped or film-shaped second insulating member is adhered to a top surface of the cooling base portion through a sheet-shaped or film-shaped second adhesive, a heating member is provided on a top surface of the second insulating member, and the electrostatic chuck portion and the cooling base portion, where the heating member is provided, are adhered to each other and integrated through an organic adhesive layer.

Advantageous Effects of Invention

In the electrostatic chuck device according to the present invention, a sheet-shaped or film-shaped first insulating member is adhered to the second main surface of the ceramic plate-shaped body through a sheet-shaped or film-shaped first adhesive so as to cover a periphery of the internal electrode for electrostatic adsorption, a sheet-shaped or film-shaped second insulating member is adhered to a top surface of the cooling base portion through a sheet-shaped or film-shaped second adhesive, a heating member is provided on a top surface of the second insulating member, and the electrostatic chuck portion and the cooling base portion, where the heating member is provided, are adhered to each other and integrated through an organic adhesive layer. Therefore, breakdown between the electrostatic chuck portion and the cooling base portion can be prevented, and voltage endurance can be improved. In addition, uniformity in the in-plane temperature of the mounting surface of the electrostatic chuck portion where the plate-shaped sample is mounted can be improved, and a uniform voltage can be applied between the electrostatic chuck portion and the cooling base portion. Therefore, voltage endurance of the heating member can be improved.

BRIEF DESCRIPTION OF DRAWINGS

FIG. 1 is a schematic cross-sectional view showing an embodiment of an electrostatic chuck device according to the present invention.

DESCRIPTION OF EMBODIMENTS

An embodiment of an electrostatic chuck device according to the present invention will be described.

The embodiment will be described in detail for easy understanding of the concept of the present invention, but the present invention is not limited thereto unless specified otherwise.

[Electrostatic Chuck Device]

FIG. 1 is a schematic cross-sectional view showing an example of an electrostatic chuck device according to the embodiment.

An electrostatic chuck device 10 according to the embodiment is schematically configured to include: a disk-shaped electrostatic chuck portion 11; a disk-shaped thick cooling base portion 12 that adjusts a temperature of the electrostatic chuck portion 11 to a desired value; a second insulating member 14 that is adhered to a top surface 12a of the cooling base portion 12 through a second adhesive 13; a heater element (heating member) 15 that is provided on a bottom surface (second main surface) side of the electrostatic chuck portion 11 and a top surface 14a of the second insulating member 14 in a predetermined pattern; and an organic adhesive layer 16 through which the electrostatic chuck portion 11 and the heater element 15 on the cooling base portion 12 are adhered to each other and integrated in a state of being opposite to each other.

The electrostatic chuck portion 11 is schematically configured to include: a mounting plate (ceramic plate-shaped body) 17 having a top surface (first main surface) 17a as a mounting surface on which a plate-shaped sample such as a semiconductor wafer is mounted; an internal electrode 18 for electrostatic adsorption that is provided on a bottom surface (second main surface) 17b of the mounting plate 17; a first insulating member 20 that is adhered to a periphery of the internal electrode 18 for electrostatic adsorption on the bottom surface 17b of the mounting plate 17 through a first adhesive 19; and a power feeding terminal 21 that applies a direct current voltage to the internal electrode 18 for electrostatic adsorption and is provided so as to pass through the first adhesive 19, the first insulating member 20, the organic adhesive layer 16, the second adhesive 13, the second insulating member 14, and the cooling base portion 12.

The first insulating member 20 covers the periphery of the internal electrode 18 for electrostatic adsorption (a surface of the internal electrode 18 for electrostatic adsorption other than a surface in contact with the mounting plate 17) through the first adhesive 19. As a result, the mounting plate 17 and the internal electrode 18 for electrostatic adsorption are integrated.

The mounting plate 17 is a disk-shaped member which is formed of an insulating ceramic sintered compact having a mechanical strength and durability to corrosive gas and plasma thereof, for example, an aluminum oxide-silicon carbide ($Al_2O_3$—SiC) composite sintered compact, an aluminum oxide ($Al_2O_3$) sintered compact, an aluminum nitride (AlN) sintered compact, an yttrium oxide ($Y_2O_3$) sintered compact, or a rare earth metal-aluminum composite oxide.

On the mounting surface (top surface (first main surface)) 17a of the mounting plate 17, plural protrusions 17c are provided at predetermined intervals. These protrusions 17c are configured to support the plate-shaped sample such as a semiconductor wafer.

It is preferable that the total thickness of the mounting plate 17, the internal electrode 18 for electrostatic adsorption, the first adhesive 19, and the first insulating member 20, that is, the thickness of the electrostatic chuck portion 11 is 0.3 mm or more and 5.0 mm or less. The reason for this is as follows. When the thickness of the electrostatic chuck portion 11 is less than 0.3 mm, the mechanical strength of the electrostatic chuck portion 11 cannot be secured. On the other hand, when the thickness of the electrostatic chuck portion 11 is more than 5.0 mm, the heat capacity of the electrostatic chuck portion 11 is excessively increased, and the thermal responsiveness of the plate-shaped sample mounted on the top surface 17a of the mounting plate 17 deteriorates. Further, due to an increase in the heat transfer of the electrostatic chuck portion 11 in a horizontal direction, it is difficult to maintain the in-plane temperature of the plate-shaped sample in a desired temperature pattern.

In particular, it is preferable that the thickness of the mounting plate 17 is 0.2 mm or more and 3.0 mm or less.

The reason why the thickness of the mounting plate 17 is preferably in the above-described range is as follows. When the thickness of the mounting plate 17 is less than 0.2 mm, discharge is likely to occur due to a voltage applied to the internal electrode 18 for electrostatic adsorption. On the other hand, when the thickness of the mounting plate 17 is more than 3.0 mm, the plate-shaped sample cannot be sufficiently adsorbed and fixed. Therefore, it is difficult to sufficiently heat the plate-shaped sample.

The internal electrode 18 for electrostatic adsorption is used as an electrode for an electrostatic chuck that generates charges and fixes the plate-shaped sample due to an electrostatic adsorption force, and the shape and size thereof are appropriately adjusted according to the intended use.

The internal electrode 18 for electrostatic adsorption is formed of a conductive ceramic such as an aluminum oxide-tantalum carbide ($Al_2O_3$—$Ta_4C_5$) conductive composite sintered compact, an aluminum oxide-tungsten ($Al_2O_3$—W) conductive composite sintered compact, an aluminum oxide-silicon carbide ($Al_2O_3$—SiC) conductive composite sintered compact, an aluminum nitride-tungsten (AlN—W) conductive composite sintered compact, an aluminum nitride-tantalum (AlN—Ta) conductive composite sintered compact, or an yttrium oxide-molybdenum ($Y_2O_3$—Mo) conductive composite sintered compact; or high melting point metal such as tungsten (W), tantalum (Ta), or molybdenum (Mo).

The thickness of the internal electrode 18 for electrostatic adsorption is not particularly limited but is preferably 0.1 μm or more and 100 μm or less and more preferably 1 μm or more and 50 μm or less.

The reason why the thickness of the internal electrode 18 for electrostatic adsorption is preferably in the above-described range is as follows. When the thickness of the internal electrode 18 for electrostatic adsorption is less than 0.1 μm, sufficient conductivity cannot be secured. On the other hand, when the thickness of the internal electrode 18 for electrostatic adsorption is more than 100 μm, a joint interface between the internal electrode 18 for electrostatic adsorption and the mounting plate 17 is likely to crack due to a difference in thermal expansion coefficient between the internal electrode 18 for electrostatic adsorption and the mounting plate 17.

The internal electrode 18 for electrostatic adsorption having a thickness in the above-described range can be easily formed using a film forming method such as sputtering or vapor deposition or a coating method such as screen printing.

The first adhesive 19 is interposed between the internal electrode 18 for electrostatic adsorption and the first insulating member 20 and adheres the first insulating member 20 to the periphery of the internal electrode 18 for electrostatic adsorption.

As the first adhesive 19, for example, a sheet-shaped or film-shaped adhesive resin having heat resistance and insulating characteristics such as a polyimide resin, a silicone resin, or an epoxy resin is used.

The thickness of the first adhesive 19 is preferably 5 μm or more and 100 μm or less and more preferably 10 μm or more and 50 μm or less.

It is preferable that a variation of the in-plane thickness of the first adhesive 19 is within 10 μm.

The reason why a variation in the in-plane thickness of the first adhesive 19 is preferably within the above-described range is as follows. It is not preferable that a variation in the in-plane thickness of the first adhesive 19 is more than 10 μm because a variation of more than 10 μm is generated at a gap between the cooling base portion 12 and the first insulating member 20. As a result, when the temperature of the electrostatic chuck portion 11 is controlled by the cooling base portion 12, in-plane uniformity deteriorates, and the in-plane temperature on the mounting surface of the electrostatic chuck portion 11 is non-uniform.

The first insulating member 20 surrounds the internal electrode 18 for electrostatic adsorption through the first adhesive 19, protects the internal electrode 18 for electrostatic adsorption from corrosive gas and plasma thereof, and allows the mounting plate 17 and the internal electrode 18 for electrostatic adsorption to be adhered to each other and integrated.

As the first insulating member 20, for example, a sheet-shaped or film-shaped insulating resin having heat resistance and insulating characteristics such as a polyimide resin, a silicone resin, or an epoxy resin is used.

The thickness of the first insulating member 20 is preferably 5 µm or more and 300 µm or less and more preferably 10 µm or more and 100 µm or less.

It is preferable that a variation of the in-plane thickness of the first insulating member 20 is within 10 µm.

The reason why a variation in the in-plane thickness of the first insulating member 20 is preferably within the above-described range is as follows. There is a difference in temperature distribution due to a difference in the in-plane thickness of the first insulating member 20. As a result, there is an adverse effect when the temperature of the first insulating member 20 is controlled by adjusting the thickness thereof, which is not preferable.

It is preferable that the thermal conductivity of the first insulating member 20 is 0.1 W/mk or higher.

Here, it is not preferable that the thermal conductivity of the first insulating member 20 is lower than 0.1 W/mk because heat transfer from the heater element 15 to the mounting plate 17a is inhibited, and a temperature increase rate decreases.

The power feeding terminal 21 is a columnar member which is provided to apply a direct current voltage to the internal electrode 18 for electrostatic adsorption. The power feeding terminal 21 includes a columnar first electrode 22 and an insulator 23 having insulating characteristics.

A material of the columnar first electrode 22 is not particularly limited as long as it is a conductive material having satisfactory heat resistance. However, a material having a thermal expansion coefficient similar to that of the internal electrode 18 for electrostatic adsorption is preferable. For example, a corrosion-resistant member constituting the internal electrode 18 for electrostatic adsorption or a metal material such as tungsten (W), tantalum (Ta), molybdenum (Mo), niobium (Nb), or a cobalt alloy is preferably used.

The columnar first electrode 22 is insulated from the cooling base portion 12 by the insulator 23 having insulating characteristics.

In addition, the columnar first electrode 22 is connected to the internal electrode 18 for electrostatic adsorption through a conductive adhesive 24.

The power feeding terminal 21 and the insulating member 20 are adhered to each other and integrated to constitute the electrostatic chuck portion 11.

The cooling base portion 12 is a thick disk-shaped member which adjusts a temperature of the electrostatic chuck portion 11 to a desired value.

As the cooling base portion 12, for example, a water-cooling base in which a flow path (not shown) for circulating water is formed is preferable.

A material constituting the cooling base portion 12 is not particularly limited as long as it is metal having satisfactory thermal conductivity, electrical conductivity, and workability or a compound material containing the metal. For example, aluminum (Al), an aluminum alloy, copper (Cu), a copper alloy, or stainless use steel (SUS) is preferably used. It is preferable that a surface of the cooling base portion 12 undergoes an alumite treatment or that an insulating film such as alumina is formed on the surface of the cooling base portion 12. In a case where the alumite treatment is performed or the insulating film is formed, the insulator 23 may not be used.

A metal foil-shaped second electrode 25 for applying a direct current voltage to the heater element 15 is provided so as to pass through the second adhesive 13, the second insulating member 14, and the cooling base portion 12. It is preferable that the second electrode 25 is a metal foil. However, if thermal stress can be relaxed, the second electrode 25 may be a metal fiber or a metal stranded wire. It is preferable that the heater element 15 and the second electrode 25 are connected to each other by welding. However, as long as conductivity and adhesion strength are sufficient, the heater element 15 and the second electrode 25 may be connected to each other through, for example, a conductive adhesive.

The second electrode 25 is insulated from the cooling base portion 12 by an insulator 26 having insulating characteristics. A gap between the second electrode 25 and the insulator 26 may be filled with a low-elasticity adhesive such as a silicon resin. Further, the low-elasticity adhesive may contain a filler formed of an inorganic oxide, an inorganic nitride, or an inorganic oxynitride. The filler is not particularly limited as long as it can improve thermal conductivity. For example, it is preferable that the filler is formed of aluminum oxide ($Al_2O_3$) particles or surface-coated aluminum nitride (AlN) particles formed by forming a coating layer formed of silicon oxide ($SiO_2$) on surfaces of aluminum nitride (AlN) particles.

A material of the second electrode 25 is not particularly limited as long as it is a conductive material having satisfactory heat resistance. However, a material having a thermal expansion coefficient similar to that of the heater element 15 is preferable. For example, a metal foil formed of a non-magnetic metal material constituting the heater element 15 is preferably used.

The second adhesive 13 is interposed between the cooling base portion 12 and the second insulating member 14 and adheres the second insulating member 14 to the top surface 12a of the cooling base portion 12.

As the second adhesive 13, for example, a sheet-shaped or film-shaped adhesive resin having heat resistance and insulating characteristics such as a polyimide resin, a silicone resin, or an epoxy resin is used.

The thickness of the second adhesive 13 is preferably 5 µm or more and 100 µm or less and more preferably 10 µm or more and 50 µm or less.

It is preferable that a variation of the in-plane thickness of the second adhesive 13 is within 10 µm.

The reason why a variation in the in-plane thickness of the second adhesive 13 is preferably within the above-described range is as follows. It is not preferable that a variation in the in-plane thickness of the second adhesive 13 is more than 10 µm because a variation of more than 10 µm is generated at a gap between the cooling base portion 12 and the second insulating member 14. As a result, when the temperature of the electrostatic chuck portion 11 is controlled by the cooling base portion 12, in-plane uniformity deteriorates, and the in-plane temperature on the mounting surface of the electrostatic chuck portion 11 is non-uniform.

The second insulating member 14 is interposed between the cooling base portion 12 and the heater element 15 and insulates the cooling base portion 12 and the heater element 15 from each other.

The second insulating member 14 is not particularly limited as long as it is has insulating characteristics, voltage endurance, and satisfactory durability to corrosive gas and plasma thereof. For example, the second insulating member 14 is formed of a polyimide sheet.

The thickness of the second insulating member 14 is preferably 5 μm or more and 300 μm or less and more preferably 10 μm or more and 100 μm or less.

It is preferable that a variation of the in-plane thickness of the second insulating member 14 is within 10 μm.

The reason why a variation in the in-plane thickness of the second insulating member 14 is preferably within the above-described range is as follows. There is a difference in temperature distribution due to a difference in the in-plane thickness of the second insulating member 14. As a result, there is an adverse effect when the temperature of the second insulating member 14 is controlled by adjusting the thickness thereof, which is not preferable.

The thermal conductivity of the second insulating member 14 is preferably 0.05 W/mk or higher and 0.5 W/mk or lower and more preferably 0.1 W/mk or higher and 0.25 W/mk or lower.

Here, it is not preferable that the thermal conductivity is lower than 0.1 W/mk because heat transfer from the electrostatic chuck portion 11 to the cooling base portion 12 through the second insulating member 14 is suppressed, and the cooling rate decreases. On the other hand, it is not preferable that the thermal conductivity is higher than 1 W/mk because heat transfer from the heater portion to the cooling base portion 12 through the second insulating member 14 is promoted, and the temperature increase rate decreases.

The heater element 15 is provided on the top surface 12a of the cooling base portion 12 through the adhesive 13 and the second insulating member 14.

For example, the heater element 15 is formed of two mutually independent heaters, that is, an internal heater that is formed at the center and an external heater that is formed outside a peripheral portion of the internal heater in a ring shape. The above-described second electrode 25 is connected to connection positions between the power feeding terminal and opposite end portions of each of the internal heater and the external heater.

In each of the internal heater and the external heater, a meandering pattern of a belt-shaped metal material having a narrow width is repeatedly arranged around an axis, and adjacent patterns are connected to each other, thereby forming one continuous belt-shaped heater pattern.

In the heater element 15, by controlling the internal heater and the external heater independently from each other, the in-plane temperature distribution of the plate-shaped sample fixed to the mounting surface (top surface (first main surface)) 17a of the mounting plate 17 through electrostatic adsorption can be accurately controlled.

The heater element 15 may include two or more mutually independent heater patterns as described above or may include one heater pattern. However, as in the case of the internal heater and the external heater, it is preferable that the heater element 15 includes two or more mutually independent heater patterns because the temperature of the plate-shaped sample during a treatment can be freely controlled by independently controlling the mutually independent heater patterns.

For example, the heater element 15 has a constant thickness of 0.2 mm or less and preferably 0.1 mm or less and is formed of non-magnetic metal such as titanium (Ti), tungsten (W), or molybdenum (Mo). As a method of forming the heater pattern, for example, a method of forming a desired heater pattern through etching with photolithography, a method forming a thin film through sputtering, or a method forming a thin film through plating is used.

The reason why the thickness of the heater element 15 is preferably in the above-described range is as follows. When the thickness of the heater element 15 is more than 0.2 mm, the pattern shape of the heater element 15 is reflected as a temperature distribution of the plate-shaped sample, and it is difficult to maintain the in-plane temperature of the plate-shaped sample to have a desired temperature pattern.

In addition, the reason why the heater element 15 is preferably formed of non-magnetic metal is as follows. Even when the electrostatic chuck device 10 is used in a high-frequency atmosphere, the heater element 15 does not self-heat due to high-frequency. Therefore, it is easy to maintain the in-plane temperature of the plate-shaped sample, which is mounted on the top surface 17a of the mounting plate 17, to be a desired constant temperature or a constant temperature pattern.

In addition, when the heater element 15 is formed using a non-magnetic metal thin film having a constant thickness, the thickness of the heater element 15 is constant over the entire region of a heating surface. Further, since the amount of heat generation is constant over the entire region of a heating surface, the temperature distribution in the mounting surface (the top surface 17a of the mounting plate 17) of the electrostatic chuck portion 11 can be made to be uniform.

Through the organic adhesive layer 16, the electrostatic chuck portion 11 and the heater element 15 on the cooling base portion 12 are adhered to each other and integrated in a state of being opposite to each other. In addition, the organic adhesive layer 16 has a thermal stress relaxation effect.

The organic adhesive layer 16 is formed of, for example, a cured product obtained by thermally curing a silicone resin composition or an acrylic resin.

The silicone resin composition is a resin having satisfactory heat resistance and elasticity which is a silicon compound having a siloxane bond (Si—O—Si). This silicone resin composition can be represented by, for example, the following chemical formula (1) or (2).

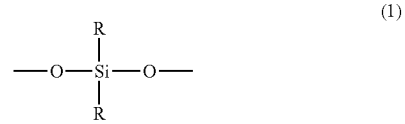

(1)

In the formula (1), R represents H or an alkyl group ($C_nH_{2n+1}$—:n represents an integer).

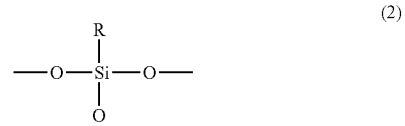

(2)

In the formula (2), R represents H or an alkyl group ($C_nH_{2n+1}$—:n represents an integer).

As the silicone resin, in particular, a silicone resin having a thermal curing temperature of 70° C. or higher and 140° C. or lower is preferable.

Here, it is not preferable that the thermal curing temperature is lower than 70° C. because when the electrostatic chuck portion 11 and the heater element 15 on the cooling base portion 12 are adhered to each other in a state of being opposite to each other, curing starts in the process of adhesion, and workability is poor. On the other hand, it is not preferable that the thermal curing temperature is higher than 140° C. because stress between the first insulating member 20 of the electrostatic chuck portion 11, the cooling base portion 12, and the second insulating member 14 increases due to a large difference in thermal expansion between the insulating member 20 of the electrostatic chuck portion 11, the cooling base portion 12 and the insulating member 14, which may cause peeling therebetween.

As the silicone resin, a resin having a Young's modulus after curing of 8 MPa or lower is preferable. Here, it is not preferable that the Young's modulus after curing is higher than 8 MPa because, when the organic adhesive layer 16 undergoes a heat cycle of temperature rise and temperature fall, a difference in thermal expansion between the first insulating member 20 of the electrostatic chuck portion 11 and the cooling base portion 12 cannot be absorbed, and the durability of the organic adhesive layer 16 deteriorates.

It is preferable that the organic adhesive layer 16 contains a filler having an average particle size of 1 μm or more and 10 μm or less formed of an inorganic oxide, an inorganic nitride, or an inorganic oxynitride, for example, aluminum oxide ($Al_2O_3$) particles.

The aluminum oxide ($Al_2O_3$) particles are incorporated in order to improve the thermal conductivity of the silicone resin, and by adjusting a mix rate thereof, a heat transfer coefficient of the organic adhesive layer 16 can be controlled.

An average particle size of the aluminum oxide ($Al_2O_3$) particles is preferably 1 μm or more and 10 μm or less and more preferably 2 μm or more and 5 μm or less.

Here, it is not preferable that the average particle size of the aluminum oxide ($Al_2O_3$) particles is less than 1 μm because contact between the particles is insufficient. As a result, the heat transfer coefficient may decrease. In addition, an excessively small particle size causes a decrease in workability such as handleability. On the other hand, it is not preferable that the average particle size is more than 10 μm because the thickness of the adhesive layer is likely to vary.

In addition, in the organic adhesive layer 16, a thermally curable acrylic resin adhesive having a Young's modulus of 1 GPa or lower and flexibility (Shore hardness: 100 or lower) may be formed. In this case, the filler may be added or may not be added.

In the electrostatic chuck device 10 according to the embodiment, the sheet-shaped or film-shaped first insulating member 20 is adhered to the second main surface 17b of the mounting plate 17 through the sheet-shaped or film-shaped first adhesive 19 so as to cover the periphery of the internal electrode 18 for electrostatic adsorption, the sheet-shaped or film-shaped second insulating member 14 is adhered to the top surface 12a of the cooling base portion 12 through the sheet-shaped or film-shaped second adhesive 13, the heater element 15 is provided on the top surface of the second insulating member 14, and the electrostatic chuck portion 11 and the cooling base portion 12, where the heater element 15 is provided, are adhered to each other and integrated through the organic adhesive layer 16. Therefore, breakdown between the electrostatic chuck portion 11 and the cooling base portion 12 can be prevented, and voltage endurance can be improved. In addition, uniformity in the in-plane temperature of the mounting surface of the electrostatic chuck portion 11 where the plate-shaped sample is mounted can be improved, and a uniform voltage can be applied between the electrostatic chuck portion 11 and the cooling base portion 12. Therefore, voltage endurance of the heater element 15 can be improved.

Next, a method of manufacturing the electrostatic chuck device 10 will be described.

First, the plate-shaped mounting plate 17 is prepared using an aluminum oxide-silicon carbide ($Al_2O_3$—SiC) composite sintered compact, an yttrium oxide ($Y_2O_3$) sintered compact, or a rare earth metal-aluminum composite oxide sintered compact.

In this case, mixed powder containing silicon carbide powder and aluminum oxide powder or yttrium oxide powder is formed into a desired shape. Next, the powder is calcinated, for example, at a temperature of 1400° C. to 2000° C. in an non-oxidative atmosphere, preferably, an inert atmosphere for a predetermined amount of time, thereby obtaining the mounting plate 17.

Next, the top surface 17a of the mounting plate 17 is ground, the thickness of the mounting plate 17 is adjusted to a desired value, the plural protrusions 17c are formed on the top surface 17a of the mounting plate 17 at predetermined intervals, and the top surface 17a of the mounting plate 17 is set as the mounting surface on which the plate-shaped sample such as a semiconductor wafer is mounted.

Next, a coating solution for forming the internal electrode for electrostatic adsorption, in which a conductive material such as the above-described conductive ceramic powder is dispersed in an organic solvent, is applied to the bottom surface 17b of the mounting plate 17 and is dried to form the internal electrode 18 for electrostatic adsorption.

As a method of applying the coating solution for forming the internal electrode for electrostatic adsorption, screen printing is preferably used because it is necessary to apply the coating solution in a uniform thickness. In addition, examples of another method include a method of forming the above-described high melting point metal thin film through vapor deposition or sputtering and a method of providing a thin plate formed of the above-described conductive ceramic or high melting point metal to form a layer for forming the internal electrode 18 for electrostatic adsorption.

Next, the surface of the internal electrode 18 for electrostatic adsorption other than a surface in contact with the mounting plate 17 is degreased and cleaned with, for example, acetone. Next, a sheet-shaped or film-shaped adhesive resin having heat resistance and insulating characteristics such as a polyimide resin, a silicone resin, or an epoxy resin is adhered so as to cover the surface, thereby obtaining the first adhesive 19.

Next, a film-shaped or sheet-shaped resin having the same planar shape as the first adhesive 19 and having insulating characteristics and voltage endurance such as a polyimide resin, a silicone resin, or an epoxy resin is adhered so as to cover a surface of the first adhesive 19 other than a surface in contact with the internal electrode 18 for electrostatic adsorption, thereby obtaining the first insulating member 20. As a result, the electrostatic chuck portion 11 is obtained in which the mounting plate 17, the internal electrode 18 for electrostatic adsorption, the first adhesive 19, and the first insulating member 20 are laminated in this order.

On the other hand, either metal or a metal-ceramic composite material is machined. Optionally, an alumite treatment is performed or an insulating film is formed. Next, the material is degreased and cleaned with, for example, acetone, thereby obtaining the cooling base portion 12.

Next, the top surface 12a of the cooling base portion 12 is degreased and cleaned with, for example, acetone. Next, a sheet-shaped or film-shaped adhesive resin having heat resistance and insulating characteristics such as a polyimide resin, a silicone resin, or an epoxy resin is adhered so as to cover the surface, thereby obtaining the second adhesive 13.

Next, a film-shaped or sheet-shaped resin having the same planar shape as the second adhesive 13 and having insulating characteristics and voltage endurance such as a polyimide resin, a silicone resin, or an epoxy resin is adhered to a surface of the second adhesive 13 opposite to a surface in contact with the cooling base portion 12, thereby obtaining the second insulating member 14.

Next, a non-magnetic metal thin plate having a constant thickness of 0.2 mm or less and preferably 0.1 mm or less, for example, a titanium (Ti) thin plate, a tungsten (W) thin plate, or a molybdenum (Mo) thin plate is adhered to the second insulating member 14. This non-magnetic metal thin plate is etched through photolithography to form a desired heater pattern, thereby obtaining the heater element 15.

Next, an organic adhesive formed of, for example, a silicone resin composition is applied to a predetermined region on the cooling base portion 12 in which the second adhesive 13, the second insulating member 14, and the heater element 15 are laminated. The amount of the organic adhesive applied is set to be within a predetermined range such that the electrostatic chuck portion 11 and the cooling base portion 12 can be adhered to each other and integrated in a state where a predetermined gap is maintained therebetween by a spacer.

Examples of a method of applying the organic adhesive include a method of manually applying the organic adhesive with a spatula or the like, a bar coating method, and screen printing. However, for example, screen printing is preferably used because it is necessary to accurately form the organic adhesive layer on the predetermined region on the cooling base portion 12.

After the application, the electrostatic chuck portion 11 and the cooling base portion 12 are laminated with the organic adhesive interposed therebetween.

Next, the gap between the electrostatic chuck portion 11 and the cooling base portion 12 is narrowing down until the thickness of the spacer, and remaining extruded adhesive is removed.

Through the above-described step, the electrostatic chuck portion 11 and the cooling base portion 12 are adhered to each other and integrated through the second adhesive 13, the second insulating member 14, and the organic adhesive layer 16.

In addition, the power feeding terminal 21 is prepared, for example, by penetrating the electrostatic chuck device 10 in a thickness direction to form a micropore in a range from the bottom surface of the cooling base portion 12 to the internal electrode 18 for electrostatic adsorption and then adjusting the size and shape of the power feeding terminal 21 such that the power feeding terminal 21 can be adhered and fixed to the micropore.

In order to prepare the power feeding terminal 21, first, the cylindrical insulator 23 is inserted into the above-described micropore.

Next, the conductive adhesive 24 is applied to a surface of the internal electrode 18 for electrostatic adsorption in contact with the columnar first electrode 22 (surface of the internal electrode 18 for electrostatic adsorption which is exposed through the micropore).

Next, the columnar first electrode 22 is prepared in the insulator 23. Examples of a method of preparing the columnar first electrode 22 include a method of forming the columnar first electrode 22 using a conductive composite sintered compact and a method of forming the columnar first electrode 22 using metal.

Examples of the method of forming the columnar first electrode 22 using a conductive composite sintered compact include a method forming a conductive ceramic powder into a desired shape and performing pressure calcination. At this time, as the conductive ceramic powder used for the columnar first electrode 22, a conductive ceramic powder formed of the same material as that of the internal electrode 18 for electrostatic adsorption is preferable.

Examples of the method of forming the columnar first electrode 22 using metal include a method of forming the columnar first electrode 22 using, for example, high melting point metal through a metal processing method such as grinding or powder metallurgy.

In addition, the second electrode 25 is prepared, for example, by penetrating the electrostatic chuck device 10 in a thickness direction to form a micropore in a range from the bottom surface of the cooling base portion 12 to the heater element 15 and inserting a metal foil-shaped electrode into the micropore. It is preferable that the second electrode 25 is a metal foil. However, if thermal stress can be relaxed, the second electrode 25 may be a metal fiber or a metal stranded wire. It is preferable that the heater element 15 and the second electrode 25 are connected to each other by welding. However, as long as conductivity and adhesion strength are sufficient, the heater element 15 and the second electrode 25 may be connected to each other through, for example, a conductive adhesive.

In order to prepare the second electrode 25, first, the cylindrical insulator 26 is inserted into the above-described micropore.

Next, the metal foil-shaped electrode is inserted into the insulator 26, thereby preparing the second electrode 25.

As the metal foil-shaped electrode, a metal foil formed of a non-magnetic metal material constituting the heater element 15 is preferably used.

In this way, the electrostatic chuck device 10 according to the embodiment is obtained.

REFERENCE SIGNS LIST

10: ELECTROSTATIC CHUCK DEVICE
11: ELECTROSTATIC CHUCK PORTION
12: COOLING BASE PORTION
13: SECOND ADHESIVE
14: SECOND INSULATING MEMBER
15: HEATER ELEMENT (HEATING MEMBER)
16: ORGANIC ADHESIVE LAYER
17: MOUNTING PLATE
18: INTERNAL ELECTRODE FOR ELECTROSTATIC ADSORPTION
19: FIRST ADHESIVE
20: FIRST INSULATING MEMBER
21: POWER FEEDING TERMINAL
22: FIRST ELECTRODE
23: INSULATOR
24: CONDUCTIVE ADHESIVE
25: SECOND ELECTRODE
26: INSULATOR

The invention claimed is:

1. An electrostatic chuck device comprising:

an electrostatic chuck portion that comprises a ceramic plate-shaped body and an internal electrode for electrostatic adsorption, wherein the ceramic plate-shaped body has a first main surface which is a mounting surface on which a sample is mounted and the internal electrode for electrostatic adsorption is provided on a second main surface of the ceramic plate-shaped body; and a cooling base portion that adjusts a temperature of the internal electrode for electrostatic adsorption, wherein a sheet-shaped or film-shaped first insulating member is adhered to the second main surface of the ceramic plate-shaped body through a sheet-shaped or film-shaped first adhesive so as to cover a periphery of the internal electrode for electrostatic adsorption, a sheet-shaped or film-shaped second insulating member is adhered to a top surface of the cooling base portion through a sheet-shaped or film-shaped second adhesive, a heating member is provided directly on a top surface of the second insulating member, and the electrostatic chuck portion and the cooling base portion, where the heating member is provided, are adhered to each other and integrated through an organic adhesive layer.

2. The electrostatic chuck device according to claim 1, wherein a power feeding terminal for applying a direct current voltage to the internal electrode for electrostatic adsorption is provided over an entire length of a micropore which is formed in a range from a bottom surface of the cooling base portion to the internal electrode for electrostatic adsorption and penetrates the first adhesive, the first insulating member, the organic adhesive layer, the second adhesive, the second insulating member, and the cooling base portion.

3. The electrostatic chuck device according to claim 2, wherein a first electrode is provided in the power feeding terminal, and the first electrode is formed of a columnar conductive material.

4. The electrostatic chuck device according to claim 1, wherein a second electrode for applying a direct current voltage to the heating member is provided and penetrates the second adhesive, the second insulating member, and the cooling base portion.

5. The electrostatic chuck device according to claim 4, wherein the second electrode is formed of a metal foil.

6. The electrostatic chuck device according to claim 3, wherein the first electrode formed of a columnar conductive material is connected to the internal electrode for electrostatic adsorption through a conductive adhesive.

* * * * *